(12) United States Patent
Ferrante

(10) Patent No.: US 6,224,273 B1
(45) Date of Patent: May 1, 2001

(54) PROCESS AND DEVICE FOR THE CONTINUOUS SEPARATION OF THE CONSTITUENTS OF AN ENGRAVING BATH

(76) Inventor: Mario Ferrante, 102 Boulevard de Hardeval, 54520 Laxou (FR)

( * ) Notice: Subject to any disclaimer, the term of this patent is extended or adjusted under 35 U.S.C. 154(b) by 0 days.

(21) Appl. No.: 09/261,052

(22) Filed: Feb. 26, 1999

Related U.S. Application Data

(63) Continuation-in-part of application No. 08/857,372, filed on May 16, 1997, now abandoned, which is a continuation of application No. 08/293,142, filed on Aug. 19, 1994, now abandoned.

(30) Foreign Application Priority Data

Aug. 19, 1993 (FR) .................................................. 93 10253

(51) Int. Cl.$^7$ ...................................................... G03D 3/06
(52) U.S. Cl. .......................... 396/565; 396/617; 396/626; 396/631; 210/744; 210/783; 210/805; 210/122; 210/167; 210/194; 210/248; 210/255; 210/387; 210/400; 210/456
(58) Field of Search .................................... 101/463–467, 101/456; 210/97, 86, 103–104, 121–122, 143, 194, 167, 171, 248, 255, 387, 400, 739, 744, 767, 783, 780, 805, 456; 396/565, 617, 626, 627, 631

(56) References Cited

U.S. PATENT DOCUMENTS

| 4,370,406 | * | 1/1983 | Jones ..................................... 430/331 |
| 5,124,736 | * | 6/1992 | Yamamoto et al. .................. 210/251 |
| 5,149,441 | * | 9/1992 | Welch, II et al. .................... 210/719 |
| 5,221,468 | * | 6/1993 | Fox et al. ............................. 210/387 |

* cited by examiner

*Primary Examiner*—Robert J. Popovics
(74) *Attorney, Agent, or Firm*—Schnader Harrison Segal & Lewis LLP

(57) ABSTRACT

The invention relates to a process for the manufacture of photopolymer printing blocks, which are utilizable for producing printed matter by flexography, typography or dry offset, of the type including a stage for polymerizing areas by exposure to ultraviolet rays; a stage for engraving non-polymerized areas by immersion and brushing in an engraving bath contained in an engraving tank, the bath becoming loaded with dissolved particles or particles in suspension during the engraving stage; and a separation of the constituents of the engraving bath, with the liquid obtained at the time of separation being injected back into the engraving tank, characterized in that the separation consists of filtration, during which the particles are progressively eliminated. The invention also relates to an engraving device for carrying out the process.

22 Claims, 2 Drawing Sheets

PROCESS AND DEVICE FOR THE CONTINUOUS SEPARATION OF THE CONSTITUENTS OF AN ENGRAVING BATH

RELATED APPLICATION

This is a continuation-in-part of application Ser. No. 08/857,372, filed on May 16, 1997, now abandoned, which is a continuation of application Ser. No. 08/293,142 filed Aug. 19, 1994, now abandoned, which is based on French patent application No. 93 10253 filed Aug. 19, 1993.

The present invention relates to an improved engraving machine for manufacturing a photopolymer printing block, which is utilisable for producing printed matter by flexography, typography or dry offset; it also relates to a process for separating the constituents of the engraving both contained in said machine.

It is already known that a printing block for flexography or typography can be obtained by exposing a sensitive photopolymer plate to ultraviolet rays and interposing a negative film, which leaves the areas which need to come into relief on the finished printing block exposed to the rays, this constituting the impression stage.

The rays harden these areas, and the material of the protected surface is then removed by brushing it with planar or rotary brushes, or by using pulverisation jets; a solvent or water acts as the damping agent, and the operation is continued until the areas which have been exposed are sufficiently in relief, this constituting the so-called engraving stage.

In the course of the engraving, the water becomes laden, then saturated, with particles of polymer, dissolved and/or in suspension: therefore, it is necessary to change the engraving bath regularly.

There is a problem relating to the saturated solution, which has to be treated in a treatment device independent of the engraving machine, then thrown away. The treatment of the solution never allows the total elimination of the polymer particles, so there is a problem relating to the protection of the environment.

Known engraving tanks also have other disadvantages;
- soiling of the brushes: the equipment needs to be regularly cleaned;
- reduction in the volume of the bath due to evaporation: hence a faster build-up in the concentration of polymer and the need to add quantities of water; and
- increase in the engraving time due to the soiling and/or evaporation of the bath.

Moreover, devices are known, for example in EP-430,233 and DE-3,338,134, having an engraving tank and a separation circuit for the constituents of the engraving bath set apart from this engraving tank, the liquid being injected back into the tank continuously after separation of the constituents.

In the document EP-430,233, the separation is achieved by decanting or filtering means, and it is impossible to replace such means in the course of engraving when they become saturated, hence the occurrence of breakdowns and the need to stop the liquid circulation in order to carry out a replacement.

In the document DE-3,238,134, the separation is achieved by a succession of decanting tanks in a complicated and cumbersome installation.

The invention seeks to find a solution to the set problem by overcoming all the above-mentioned disadvantages.

SUMMARY OF THE INVENTION

The solution according to the invention consists of a process for the manufacture of flexible printing blocks, which are utilisable for producing printed matter by flexography, typography or dry offset, of the type comprising:

- a stage for polymerising areas by exposure to ultraviolet rays;
- a stage for engraving non-polymerised areas by immersion and brushing in an engraving bath contained in an engraving tank, said bath becoming loaded with dissolved particles or particles in suspension during the engraving stage; and
- a separation of the constituents of the engraving bath, with the liquid obtained at the time of separation being injected back into the engraving tank, characterised in that the separation consists of filtration, during which the particles are progressively eliminated.

A device according to the invention comprises:

an engraving tank containing a bath and brushes; and a device for separating the constituents of the bath, operating in a closed circuit, with the liquid obtained after separation of the constituents of the bath being injected back into the engraving tank, characterised in that the separation device comprises a means of separation formed from a filter which can be replaced during the engraving as it becomes saturated.

The invention will be better understood by means of the description which follows, with reference to the single accompanying Figure.

Figure 1:
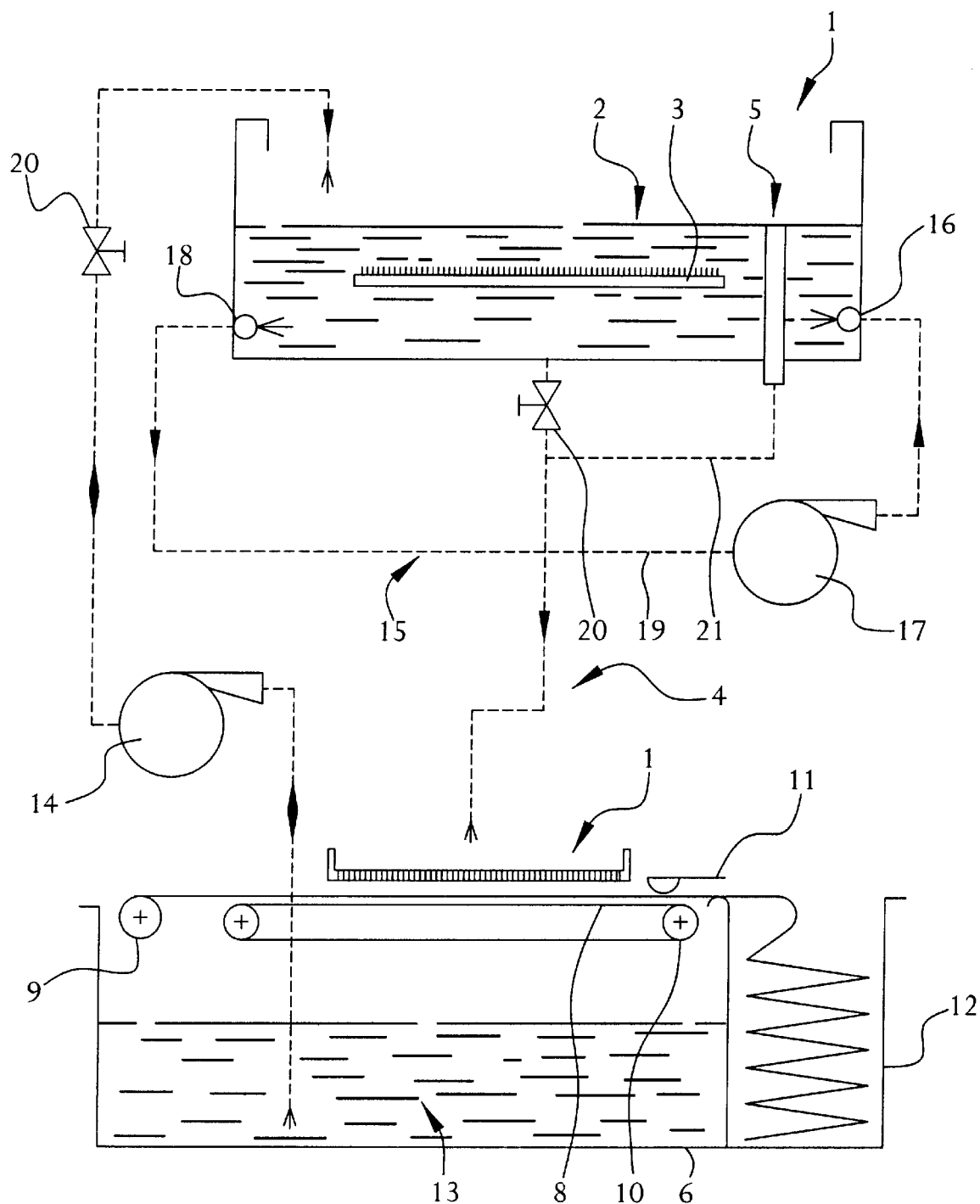
FIG. 1 is an embodiment of the apparatus according to this invention

An engraving machine according to the invention comprises a combination of:

- an engraving tank (1) containing a bath (2) and brushes (3); and
- a device (4) for separating the constituents of the bath, which operates continuously, automatically and in a closed circuit.

The engraving tank (1) comprises an overflow system (5), which carries away the solution via an outlet pipeline (21) towards the separation device (4).

This separation device (4) is basically formed from a reception tank (6), the top portion of which is provided with a means (7) for separating the water and the polymer.

According to a preferred embodiment, the separation means (7) is a filter strip (8) which is fed from a supply roll (9) and which can be unrolled automatically by an entrainment system (1) with rollers and chains.

The filter strip (8) receives and filters the solution coming from the tank after passing through a mesh or sieve (20). When the strip (8) is saturated, the level of the solution rises and raises a float (11), which forms the filter saturation detector.

The float (11) then controls the entrainment system (10) which puts a new filter strip in position, the saturated strip being emptied into a holding tank (12).

Of course, as a variant, a manual means of unrolling the filter strip can be provided.

Furthermore, the texture, the porosity and the material of the filter are chosen depending on the liquid/particle mixture which has to be filtered.

The filtered product (13), collected in the reception tank (6), is pumped by a pump (14) and injected back into the top of the engraving tank (1).

A slight reduction of the level in the engraving tank is evident, because of evaporation. This evaporation is easily compensated-for by adding water to the reception tank (6), for example the volume provided in the tank (6) being double that in the engraving tank (1). The volume of the tank (6) is dependent on the plug volume.

The machine is further improved by adding thereto a device (15) for mixing the bath solution, comprising an outlet value (16), a circulation pump (17), an injection valve (18) and an exterior pipeline (19).

The mixing device (15) makes the concentration of the bath solution homogeneous, reducing the deposit or particles in the bottom of the tank and preventing the brushes from becoming soiled.

Figure 2:
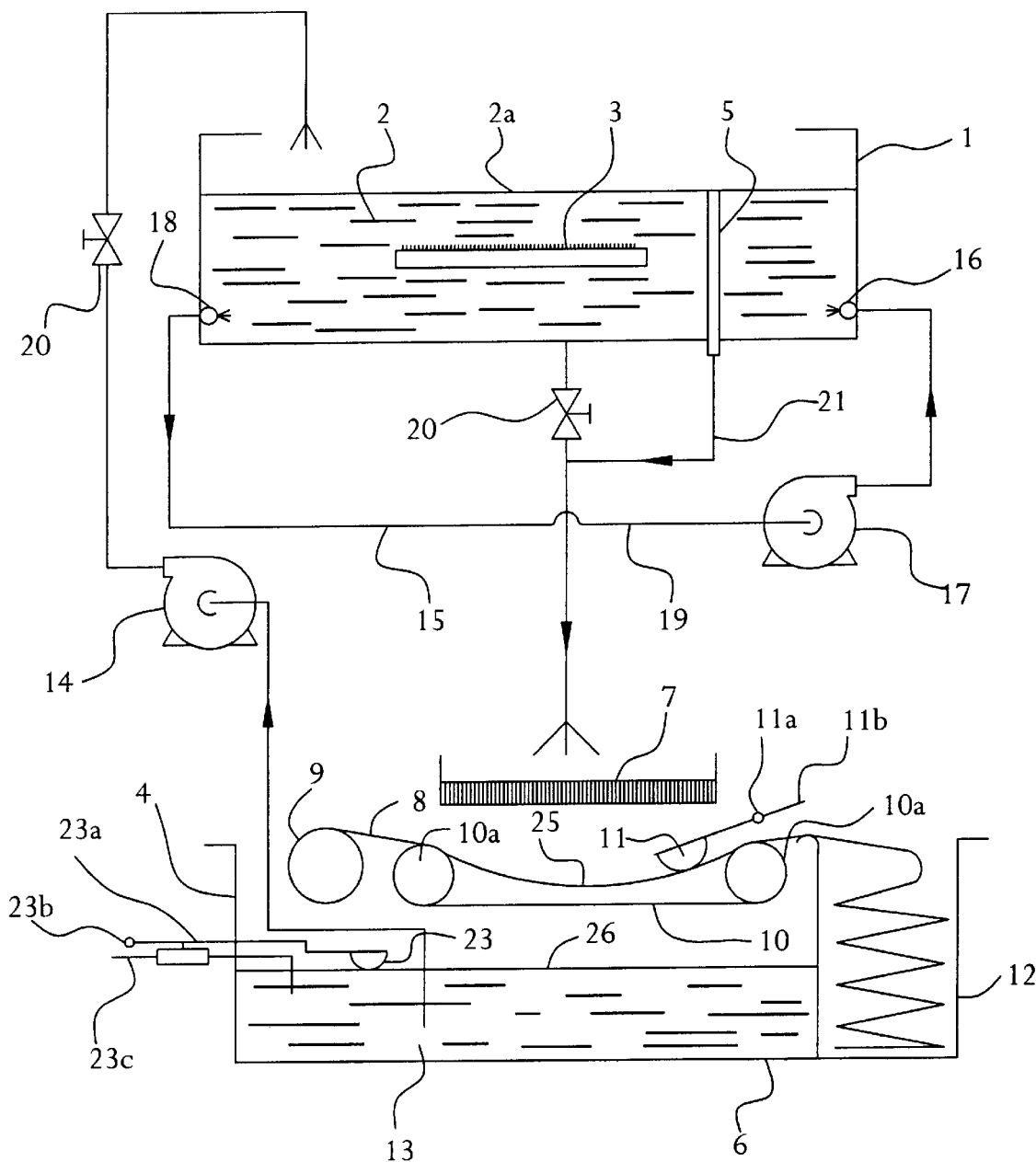
FIG. 2 is another embodiment of the apparatus according to this invention.

In a preferred embodiment as seen in FIG. 2, an apparatus according to this invention comprises a suspension tank 1 and a separation system 4. The suspension tank contains an engraving bath 2 of developer solution and particles of material removed from printing blocks (not shown) by brushes 3. The engraving bath is maintained at a liquid level 2a by overflowing into level pipe 5 and draining through pipe 21 to the separation system. The suspension tank is equipped with an external circulation system 15 which includes an intake port 18, circulation pipe 19, circulation pump 17 and injection port 16. This circulation system circulates the engraving bath at a flow designed to maintain the particles well suspended in the developer solution which keeps the concentration of the engraving bath homogeneous, reduces settling of the particles in the suspension tank, and promotes cleaning of the brushes.

Alternate methods of keeping the particles in suspension are contemplated. These include stirring methods which can be implemented by agitating the engraving bath with a submerged stirrer, for example.

Separation system 4 includes a collection tank 6 holding filtered engraving bath 13 and a distribution grid 7. A filtration unit below the grid comprises a strip of filter material 8 laid upon an open mesh, endless belt 10 that is unsupported between drive roller 10a. The filter material 8 is a material suitable for separating the particles from suspension in the developer solution to produce a filtered engraving bath. The filtration material preferably is in the form of a long strip stored on a supply roll 9. The near and far walls of tank 6 are parallel to the belt movement direction and thus are not seen in the Figure. The width of the belt is less than the distance between the near and far walls, hence the surface of the belt between drive rollers 10a is positioned entirely above filtered engraving bath 13. The upper span of the open mesh belt 10 sags in its central portion to form a depression 25 of an active filter zone between the drive rollers 10a. A float 11 is mounted on a lever 11b adapted to pivot about axis 11a (shown perpendicular to the plane of the Figure). The float is constructed of material which is buoyant in the engraving bath. The filtration unit is placed at an elevation high enough above the level 26 of filtered engraving bath in the collection tank to let the float rest upon the upper surface of the strip within the depression. The strip is directed into a holding tank 12 in a manner described in greater detail, below.

The collection tank further includes a make up water system which comprises a float 23 mounted on lever 23a adapted to pivot about axis 23b (shown perpendicular to the plane of the Figure). Fresh water can be added to the collection tank from a source (not show) through pipeline 23c. Pump 14 is provided to pump filtered engraving bath to the suspension tank.

In operation, the brushes scrape loose particles from printing blocks into the developer solution. The particles become suspended in the solution as a result of agitation created by the circulation system 15, thereby forming the engraving bath, A stream of the engraving bath of solution and suspended particles overflows into level pipe 5 and drops by gravity onto the distribution grid 7 which spreads the engraving bath stream over a large area of the depression 25 of the filter strip. Initially, the filter strip in the active filter zone is clean. Therefore, particles are captured on the filter strip while filtered engraving bath passes freely through the filter material and is pumped by pump 14 to the suspension tank 1. Float 23 floats on level 26. If this level falls below a preselected low level limit, the position of lever 23b triggers the operation of valve means (not shown) to allow fresh water into collection tank 6 through pipe 23c. Float 23 detects when filtered engraving bath level 26 rises to a preselected elevation and causes the valve means to stop fresh water flow into the collection tank. Level 26 can drop due to evaporation of liquid and loss of liquid which is carried into the holding tank 12 with saturated wet filter strip, as will now be explained.

While the filter strip in the active filter zone is clean, filtration occurs rapidly and liquid quickly passes through the filter strip. Float 11 thus rides at a low position in contact with the strip of filter material in depression 25. As the filter strip captures increasing amounts of particles, the filtration material becomes partially then increasingly saturated with solids. The weight of the engraving bath and captured solids continuing to fall onto the active filter zone causes the depression to become further pronounced. Consequently, a pool of liquid accumulates in the depression and eventually buoys float 11 up. When float 11 rises above a preselected high level, lever 11b triggers belt activation means (not shown) to move the belt. This movement causes filter strip saturated with wet solids to discharge from the depression toward the holding tank 12. Waste filter material is stored temporarily in the holding tank and then discarded. Simultaneously, fresh filtration material from supply roll 9 moves into position under the distribution grid in the depression. The fresh filtration material allows liquid to pass through the filter strip which lowers the level of engraving bath in the depression, resets float 11 and stops the filter strip from unrolling further. The system is thus self regulating in that the filter strip is consumed only when the filtration material becomes saturated, i.e., saturated by solids.

It is thus seen that the filter strip is continuously renewed while filtering occurs. Consequently, constant operation can be maintained even while the filter strip is moved to expose fresh filtration material. Therefore, separation of particles from the developer solution can continue at all times, including while saturated filter strip is replaced. Furthermore, processing of printing blocks in the suspension tank can continue without interruption. Consequently, all overflowing engraving bath passes is filtered by the filter material and substantially none bypasses the strip, even during filter cleaning. The apparatus can operate automatically without stopping flow to clean the filter. Manual operation is also possible.

Of course, the machine also comprises convention fittings: for example, drain valves (20), control devices and safety devices not shown.

The advantages and performances of the machine are numerous and include:

overcoming the problem of throwing away the used water daily;

saving water;

a fully automatic system, so there is no need for the daily manipulation of the filtration systems of prior art;

keeping the vat and the brushes virtually always clean;

maintaining a constant level in the engraving vat by means of evaporation compensation, hence there is a constant level of solution above the brushes, ensuring that their cleaning is of a consistent quality;

saving surface area when compared with prior art, which necessitated, as well as the machine, a whole treatment installation;

a virtually constant saturation of the bath, hence a virtually constant engraving time;

saving maintenance and upkeep costs.

What is claimed is:

1. An apparatus for manufacturing flexible printing blocks for producing printed matter by flexography, typography, or dry offset printing, comprising a suspension tank comprising brush means for removing particle developed from the printing blocks by a developer solution, agitation means for agitating the developer solution in the suspension tank at a rate effective to produce an engraving bath of the particles suspended in the developer solution, and a level pie adapted to withdraw the engraving bath so as to maintain a fixed level of the developer solution in the suspension tank, and a separation system positioned below the fixed level comprising a collection tank containing a filtered engraving bath, means for automatically adding water to the collection tank in amount effective to maintain the filtered engraving bath at a level above a preselected minimum, pump means for pumping filtered engraving bath from the collection tank to the suspension tank, and a filtration unit positioned above the filtered engraving bath comprising a strip of filter material adapted to remove the suspended particles from the engraving bath, the strip being supported on an open mesh, endless belt defining a depression of an active filter zone, a float buoyant in the engraving bath and affixed to a pivotally mounted lever which permits the float to rest upon the strip in the active filter zone while the filter material in the active filter zone is clean and to float in engraving bath while the filter material in the active filter zone is saturated, and means for moving the strip to replace saturated filter material with clean filter material in the active filter zone while the float is above a preselected high level limit.

2. The apparatus of claim 1 in which the agitation means comprises an inlet port at a first position in the suspension tank, an injection nozzle at a second position in the suspension tank distant from the first position, a circulation pump, and a transfer pipe connecting the inlet port and injection nozzle to the circulation pump to recirculate developer solution and suspended particles through the suspension tank.

3. The apparatus of claim 1 in which the agitation means comprises a submerged stirrer.

4. The apparatus of claim 1 in which the collection tank is positioned below the suspension tank.

5. The apparatus of claim 4 in which the filtration unit is positioned below the suspension tank.

6. The apparatus of claim 1 further comprising grid means positioned between the suspension tank and the filtration unit for distributing the engraving bath over a large area of the active filter zone.

7. A process for manufacturing flexible printing blocks for producing printed matter by flexography, typography, or dry offset printing, comprising the steps of:

removing particles developed from the printing blocks, entraining the particles in a developer solution to form an engraving bath of particles in a suspension tank, pouring a stream of engraving bath onto a strip of filter material adapted to remove the entrained particles from the engraving bath, the strip being supported on an open mesh, endless belt defining a depression of an active filter zone, thereby capturing particles on the strip in the active filter zone, allowing filtered engraving bath substantially free of particles to pass through the strip, and causing a pool of engraving bath to form on the strip in the active zone as the filter material becomes increasingly saturated with particles, collecting filtered engraving bath in a collection tank, transferring a stream of filtered engraving bath to the suspension tank, detecting the level of the pool on the strip, and moving the strip to replace saturated filter material with virgin filter material in the active filter zone when the pool level increases above a preselected high level limit.

8. The process of claim 7 in which the detecting step comprises using a float buoyant in the engraving bath and affixed to a pivotally mounted lever which permits the float to rest upon the strip in the active filter zone while the filter material in the active filter zone is clean and to float in the pool while the filter material in the active filter zone is saturated.

9. The process of claim 8 further comprising the step of maintaining the engraving bath at a fixed level in the suspension tank.

10. The process of claim 9 in which the step of maintaining the engraving bath at a fixed level comprised draining the engraving bath by gravity through a level pipe in the suspension tank onto the active filter zone.

11. The process of claim 10 in which the collection tank is positioned below the fixed level of engraving bath in the suspension tank and the step of transferring filtered engraving bath comprises pumping filtered engraving bath from the collection tank to the suspension tank.

12. The process of claim 7 further comprising the step automatically adding water to the collection tank in amount effective to maintain the filtered engraving bath at a level above a preselected minimum.

13. The process of claim 12 in which the agitating step comprises agitating the engraving bath in the suspension tank with a submerged stirrer.

14. The process of claim 7 further comprising the step of agitating the engraving bath in the suspension tank at a rate effective to keep the entrained particles in the suspension tank suspended in the engraving bath.

15. The process of claim 14 in which the agitating step comprises recirculating the engraving bath through external recirculation equipment comprising an inlet port at a first position in the suspension tank, an injection nozzle at a second position in the suspension tank distant from the first position, a circulation pump, and a transfer pipe connecting the inlet port and injection nozzle to the circulation pump.

16. A process for manufacturing flexible printing blocks for producing printed matter by flexography, typography, or dry offset printing, comprising the steps of:

removing particles developed from the printing blocks, entraining the particles in a developer solution to form an engraving bath of particles in a suspension tank, recirculating the engraving bath through external recirculation equipment comprising an inlet port at a first position in the suspension tank, an injection nozzle at a second position in the suspension tank distant from the first position, a circulation pump, and a transfer pipe connecting the inlet port and injection nozzle to the circulation pump, at a rate effective to keep the entrained particles in the suspension tank suspended in the engraving bath, draining the engraving bath by gravity through a level pipe in the suspension tank, thereby maintaining the bath in the suspension tank at a fixed level, pouring the engraving bath drained from the suspension tank onto a strip of filter material adapted to remove the entrained particles from the engraving bath, the strip being supported on an open mesh, endless belt defining a depression of an active filter zone, thereby capturing particles on the strip in the active filter zone, allowing filtered engraving bath substantially free of particles to pass through the strip, and causing a pool of engraving bath to form on the strip in the active zone as the filter material becomes increasingly saturated with particles, collecting filtered engraving bath in a collection tank positioned below the filter strip, pumping a stream of filtered engraving bath to the suspension tank, automatically adding water to the collection tank in amount effective to maintain the filtered engraving bath at a level above a preselected minimum, detecting the level of the pool on the strip using a float buoyant in the engraving bath and affixed to a pivotally mounted lever which permits the float to rest upon the strip in the active filter zone while the filter material in the active filter zone is clean and to flat in the pool while the filter material in the active filter zone is saturated, and moving the strip to replace saturated filter material with virgin filter material in the active filter zone when the pool level increases above a preselected high level limit.

17. The process of claim 16 in which the entraining, draining, pouring, collecting, pumping, and detecting steps are performed concurrently.

18. The process of claim 17 in when entraining, draining, pouring, collecting, pumping, and detecting steps are performed continuously.

19. The process of claim 18 in which the moving step is carried out while the entraining, draining, pouring, collecting, pumping, and detecting steps are performed.

20. The process of claim 19 in which substantially all of the engraving bath drained from the suspension tank during operation of the process is filtered by the filter strip.

21. The process of claim 16 in which the removing step continues without interrupting to clean the strip in the active filter zone.

22. The process of claim 16 further comprising the step of distributing the engraving bath drained from the suspension tank over a large area of the active filter zone.

* * * * *